(12) United States Patent
Hwang

(10) Patent No.: US 10,832,849 B2
(45) Date of Patent: Nov. 10, 2020

(54) WIRELESS POWER TRANSMISSION APPARATUS FOR VEHICLE

(71) Applicant: Amogreentech Co., Ltd., Gimpo-si (KR)

(72) Inventor: Seung Jae Hwang, Incheon (KR)

(73) Assignee: Amogreentech Co., Ltd., Gimpo-si (KR)

( * ) Notice: Subject to any disclaimer, the term of this patent is extended or adjusted under 35 U.S.C. 154(b) by 107 days.

(21) Appl. No.: 16/301,892

(22) PCT Filed: May 18, 2017

(86) PCT No.: PCT/KR2017/005151
§ 371 (c)(1),
(2) Date: Nov. 15, 2018

(87) PCT Pub. No.: WO2017/200310
PCT Pub. Date: Nov. 23, 2017

(65) Prior Publication Data
US 2019/0221353 A1 Jul. 18, 2019

(30) Foreign Application Priority Data
May 18, 2016 (KR) .................... 10-2016-0061057

(51) Int. Cl.
*H01F 27/02* (2006.01)
*C09D 163/00* (2006.01)
(Continued)

(52) U.S. Cl.
CPC ............ *H01F 27/025* (2013.01); *C09D 7/61* (2018.01); *C09D 163/00* (2013.01); *C09K 5/14* (2013.01);
(Continued)

(58) Field of Classification Search
CPC ........ H01F 27/025; H01F 38/14; H01F 27/28; H01F 27/02; H01F 27/2876;
(Continued)

(56) References Cited

U.S. PATENT DOCUMENTS

| 9,533,589 | B2 * | 1/2017 | Garcia Briz | ............ H02J 50/70 |
| 2011/0214926 | A1 * | 9/2011 | Ichikawa | ................ H02J 5/005 |
| | | | | 180/2.1 |

(Continued)

FOREIGN PATENT DOCUMENTS

| KR | 10-2015-0024713 A | 3/2015 |
| KR | 10-2016-0000997 U | 1/2016 |

(Continued)

OTHER PUBLICATIONS

International Search Report dated Sep. 8, 2017 for International Application No. PCT/KR2017/005151; 4 Pages.

(Continued)

*Primary Examiner* — Jared Fureman
*Assistant Examiner* — Michael J Warmflash
(74) *Attorney, Agent, or Firm* — Daly Crowley Mofford & Durkee, LLP

(57) ABSTRACT

A wireless power transmission device for a vehicle is provided. The wireless power transmission device according to an exemplary embodiment of the present invention comprises: a wireless power transmission module comprising at least one flat coil for transmitting wireless power and a magnetic field shielding sheet arranged on one surface of the flat coil; a heat radiating case for radiating heat generated by a heat source, with the wireless power transmission module being coupled to one side thereof and at least one circuit board for driving the wireless power transmission module being embedded therein; a heat radiating coating layer applied to the outer surface of the heat radiating case; and a (Continued)

cover detachably coupled to the heat-radiating case. The wireless power transmission device for the vehicle described above may be installed or embedded within a vehicle for using in charging the main battery of a portable terminal.

19 Claims, 9 Drawing Sheets

(51) Int. Cl.

| | | |
|---|---|---|
| H01F 38/14 | (2006.01) | |
| H05K 7/20 | (2006.01) | |
| H01F 27/28 | (2006.01) | |
| H02J 7/02 | (2016.01) | |
| H05K 9/00 | (2006.01) | |
| H02J 50/10 | (2016.01) | |
| H02J 50/70 | (2016.01) | |
| C09D 7/61 | (2018.01) | |
| C09K 5/14 | (2006.01) | |
| H01F 27/36 | (2006.01) | |
| H05K 5/03 | (2006.01) | |
| H05K 5/04 | (2006.01) | |
| H02J 50/00 | (2016.01) | |

(52) U.S. Cl.
CPC ............. *H01F 27/02* (2013.01); *H01F 27/28* (2013.01); *H01F 27/2876* (2013.01); *H01F 27/2885* (2013.01); *H01F 27/36* (2013.01); *H01F 38/14* (2013.01); *H02J 7/02* (2013.01); *H02J 7/025* (2013.01); *H02J 50/00* (2016.02); *H02J 50/10* (2016.02); *H02J 50/70* (2016.02); *H05K 5/03* (2013.01); *H05K 5/04* (2013.01); *H05K 7/20* (2013.01); *H05K 7/209* (2013.01); *H05K 7/20427* (2013.01); *H05K 7/20509* (2013.01); *H05K 9/00* (2013.01); *H05K 9/0075* (2013.01)

(58) Field of Classification Search
CPC ..... H01F 27/2885; H01F 27/365; C09K 5/14; H02J 7/025; H02J 50/00; H02J 7/02; H02J 50/10; H02J 50/70; H05K 5/03; H05K 5/04; H05K 7/20427; H05K 7/20509; H05K 7/209; H05K 9/0075; H05K 7/2039; H05K 7/20; H05K 9/00; C09D 163/00; C09D 7/61
See application file for complete search history.

(56) References Cited

U.S. PATENT DOCUMENTS

| | | | |
|---|---|---|---|
| 2013/0249480 A1* | 9/2013 | Paparo | H02J 7/0044 320/108 |
| 2013/0322021 A1* | 12/2013 | Ohoka | H05K 7/209 361/714 |
| 2014/0035520 A1* | 2/2014 | Nakayama | B60L 53/38 320/108 |
| 2014/0197913 A1* | 7/2014 | Ohoka | H01F 27/02 336/92 |
| 2015/0022142 A1 | 1/2015 | Garcia Briz et al. | |
| 2016/0248278 A1* | 8/2016 | Ebe | H02J 7/025 |

FOREIGN PATENT DOCUMENTS

| | | | |
|---|---|---|---|
| KR | 10-2016-0010972 A | | 1/2016 |
| KR | 20160010972 A | * | 1/2016 |
| KR | 10-2016-0047266 A | | 5/2016 |
| WO | WO 2015/064342 A1 | | 5/2015 |

OTHER PUBLICATIONS

Extended European Search Report dated Jan. 8, 2020 for European Application No. 17799667.5; 5 Pages.

\* cited by examiner

WIRELESS POWER TRANSMISSION APPARATUS FOR VEHICLE

CROSS-REFERENCE TO RELATED APPLICATION

This application is a U.S. National Stage of PCT/KR2017/005151 filed in the Korean language on May 18, 2017, entitled "WIRELESS POWER TRANSMISSION APPARATUS FOR VEHICLE," which application claims the priority benefit of Korean Patent Application No. 10-2016-0061057 filed on May 18, 2016 in the Korean Intellectual Property Office, the disclosure of which is incorporated herein by reference.

BACKGROUND OF THE DISCLOSURE

Field of the Disclosure

The present invention relates to wireless power transmission, and more particularly to a wireless power transmission device for a vehicle.

Description of the Related Art

Wireless charging technologies which enable an electronic device to charge its battery by directly transferring and receiving power without using a power line become trends at portable electronic devices such as mobile phones, smart phones, tablet PCs, notebooks, digital broadcasting terminals, personal digital assistants (PDAs), portable multimedia players (PMPs). Recently, this wireless charging technologies expand to the charges in vehicles.

A wireless power transmission device which is embedded in the vehicle let electric energy sourced from the vehicle transfer the power in a wireless transmission manner to the battery of the mobile terminals.

As a non-contact type charging method, a magnetic induction method is widely used. That is, when the mobile terminal approaches the wireless power transmission device embedded in the vehicle, the magnetic induction method is applied to the induction coupling between the primary coil included in the wireless power transmission device and the secondary coil in the wireless power reception module to charge the battery of the mobile terminal.

The wireless power transmission device is made of a cover with an outer case to be installed in a vehicle, and the outer case is made of aluminum to radiate heat.

However, the outer case made of an aluminum material is effective to a certain degree of heat-radiating, but there is a limit to lowering the surface temperature of the cover contacting with the mobile terminal.

SUMMARY OF THE DISCLOSURE

To solve the above problems and defects, it is an object of the present invention to provide a wireless power transmission device for a vehicle capable of lowering the surface temperature of a cover by forming a heat-radiating coating layer for enhancing heat-radiating performance in a heat-radiating case coupled with a cover.

It is another object of the present invention to provide a wireless power transmission device for a vehicle capable of enhancing adhesion and improving a heat generation problem generated in a flat coil by disposing a heat radiating plate made of a metal material on one surface of a magnetic field shielding sheet.

To accomplish the above and other objects of the present invention, according to an aspect of the present invention, there is provided a wireless power transmission device for a vehicle including a wireless power transmission module comprising at least one flat coil for transmitting wireless power and a magnetic field shielding sheet disposed at one side of the flat coil; a heat-radiating case coupled to one side of the wireless power transmission module, and including at least one circuit board for driving the wireless power transmission module, for emitting heat generated from the heat source; a heat-radiating coating layer applied to an outer surface of the heat-radiating case; and a cover detachably coupled to the heat-radiating case.

According to a preferred embodiment of the present invention, the heat-radiating coating layer may include a coating layer-forming component comprising a main resin; a carbon-based filler in an amount of 8 to 72 parts by weight based on 100 parts by weight of the main resin; and a physical property enhancing component for improving heat-radiating and adhesion.

Here, the carbon-based filler may include at least one of graphite and carbon black. The main resin may be a glycidyl ether type epoxy resin including a bisphenol A type epoxy resin. The bisphenol A type epoxy resin may have an epoxy equivalent of 350 to 600 g/eq. In addition, the carbon-based filler may be carbon black having an average particle diameter of 250 nm or less.

As another example, the heat-radiating case may include a metal plate and a heat radiating member forming composition covering the outer surface of the metal plate. The heat-radiating member-forming composition may include a graphite composite in which crystallized nanomaterial particles are bonded to the surface of the graphite, and a polymer resin in which the graphite composite forms a dispersed phase.

The heat-radiating plate may be attached to one surface of the magnetic field shielding sheet through an adhesive layer having thermal conductivity. An insulation member for electrical insulation may be disposed between the heat-radiating plate and the circuit board.

In addition, the heat insulating layer may be interposed between the insulating member and the circuit board to prevent heat generated at the circuit board from being transferred to the heat-radiating plate.

To accomplish the above and other objects of the present invention, according to an aspect of the present invention, there is provided a wireless power transmission module for a vehicle including a plurality of flat coils for transmitting wireless power; a magnetic field shielding sheet for shielding a magnetic field generated from the flat coil to prevent external leakage and condensing in a desired direction; and a plate-shaped heat-radiating plate made of a metal material and attached to a surface of the magnetic field shielding sheet. Here, the heat-radiating plate may be made of copper or aluminum.

According to the present invention, the heat-radiating performance of the heat-radiating case can be improved through the heat-radiating coating layer, thereby lowering the surface temperature of the cover and improving the adhesion and heat generation problem through the heat-radiating plate.

BRIEF DESCRIPTION OF THE DRAWINGS

FIGS. 8A and 8B are schematic diagrams showing the graphite composite applied to FIG. 7, wherein FIG. 8A is composed of graphite, nano metal and catecholamine, and FIG. 8B is composed of graphite, nano metal, catecholamine and polymer.

DETAILED DESCRIPTION OF THE DISCLOSURE

Figure 1:
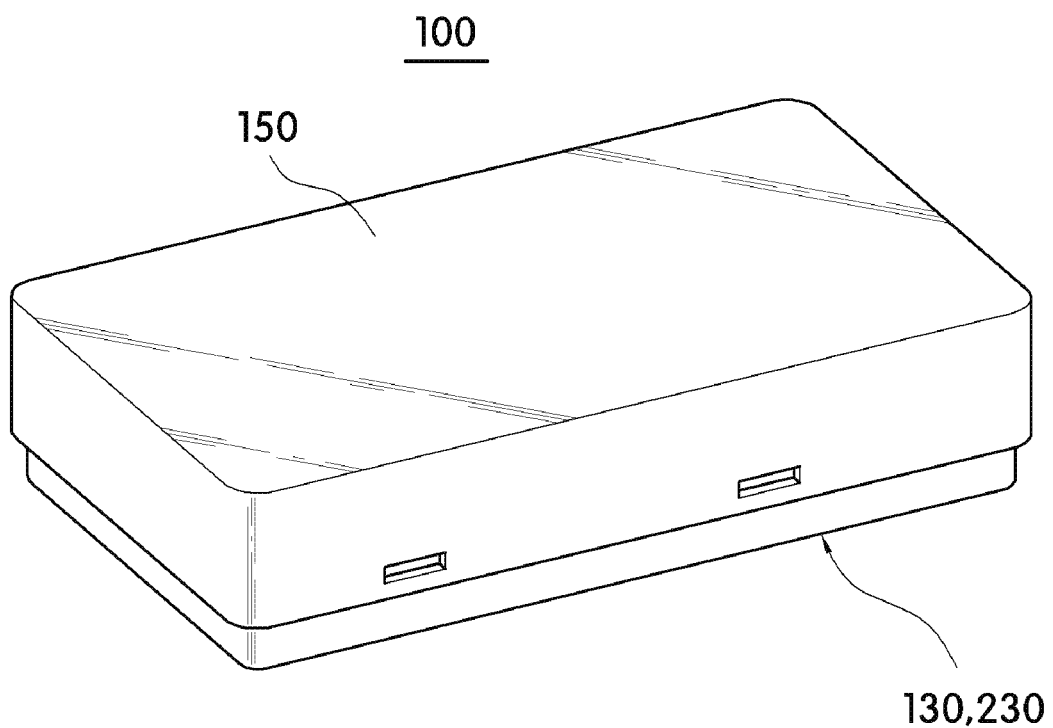
FIG. 1 is a block diagram of a wireless power transmission device according to an embodiment of the present invention

The above and other objects, features, and advantages of the present invention can be appreciated by the following description and will be understood more clearly by embodiment of the present invention. In addition, it will be appreciated that the objects and advantages of the present invention will be easily realized by means shown in the appended patent claims, and combinations thereof. Accordingly, the technical spirit of the present invention can be easily implemented by one of ordinary skill in the art. Further, if it is determined that the detailed description of the known art related to the present invention makes the gist of the present invention unnecessarily obscure, a detailed description thereof will be omitted.

The wireless power transmission device 100 according to an exemplary embodiment of the present invention includes a wireless power transmission module, a heat-radiating case 130 and 230, a heat-radiating coating layer 140, and a cover 150.

The electronic device in the present invention may be a portable electronic device such as a mobile phone, a PDA, a PMP, a tablet, a multimedia device, and the like. In addition, the wireless power transmission device 100 may be embedded so that one side of the cover 150 coupled to the heat-radiating case 130 or 230 is exposed to the outside.

The wireless power transmission module may include one or more flat coils 111, 112 and 113 and a magnetic field shielding sheet 114 for transmitting wireless power to an electronic device requiring charging.

The flat coils 111, 112, and 113 are used to transmit the power required by the electronic device by transmitting the wireless power when the power is supplied. The flat coils 111, 112, and 113 may serve as transmission coils for generating power by transmitting wireless power to the reception coils installed in the electronic device.

Here, on the electronic device side, a separate reception antenna (for example, a reception coil (Rx coil)) corresponding to the flat coils 111, 112, and 113 may be provided. Accordingly, the electric power may be transmitted by inducing a current to the reception antenna side through a change of the magnetic field in the flat coils 111, 112, and 113 due to the electromagnetic induction phenomenon.

The flat coils 111, 112, and 113 may operate in any one of the Qi mode, the PMA (Power Matters Alliance) mode, and the A4WP (Alliance For Wireless Power) mode. It is also possible to operate in a mode in which two or more of Qi, PMA and A4WP are switched according to the operation mode of the wireless power receiving module to be accessed.

The flat coils 111, 112, and 113 may have circular, elliptical, or quadrangular shapes in which conductive members each having a pair of connection terminals 111a, 112a, and 113a on both end sides are wound clockwise or counterclockwise a plurality of times. Here, the conductive member may be made of a conductive metal such as copper, and a plurality of strands having a predetermined diameter may be twisted along the longitudinal direction.

Figure 2:
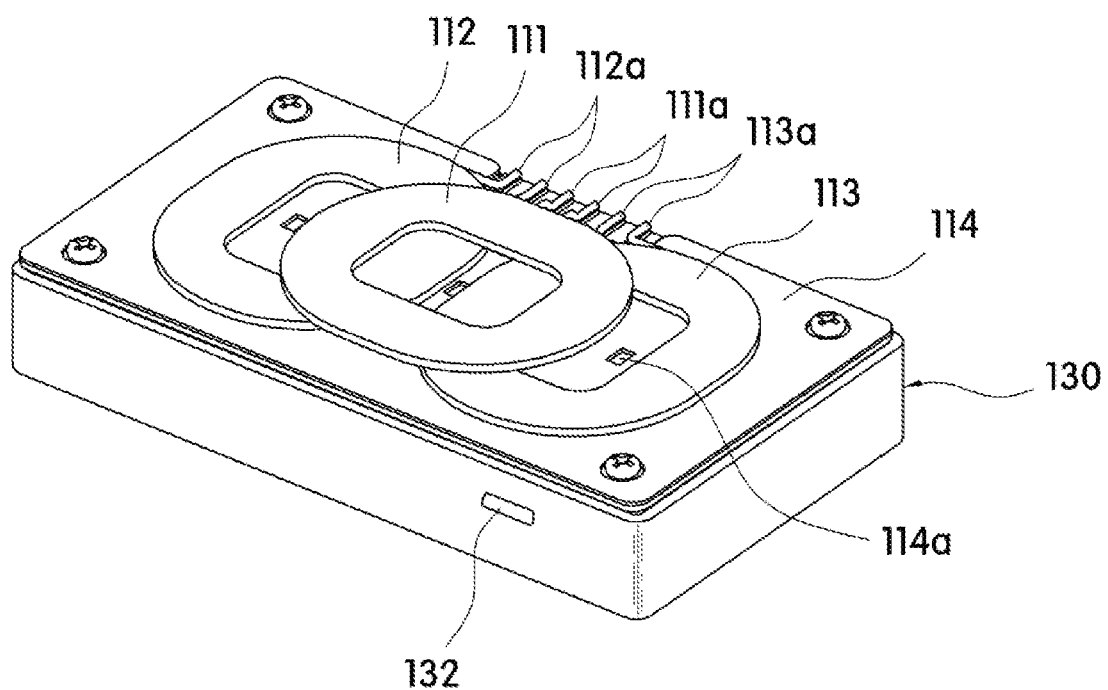
FIG. 2 is a view showing a state in which the cover is removed in FIG. 1.

Here, the plurality of the flat coils 111, 112, and 113 may be provided, and at least a part of the coils may be stacked. For example, the three flat coils 111, 112 and 113 may be provided, and one of the three flat coils 111, 112 and 113 may be disposed on the upper side of the remaining two flat coils 112 and 113 and the remaining two flat coils 112 and 113 and a part of them may overlap each other (Refer to FIG. 2).

However, the number and arrangement of the flat coils 111, 112, and 113 applied to the present invention are not limited thereto, and the arrangement relationship and the total number of the flat coils 111, 112, and 113 may be variously changed according to the design conditions.

In addition, although the flat coils 111, 112, and 113 serve as antennas for transmitting wireless power, they are not limited thereto. It is noted that the flat coils 111, 112, and 113 may be replaced with antenna patterns patterned in a loop shape using a copper foil or conductive ink on one side of the circuit board so that the antenna pattern may serve as the wireless power transmission antenna.

The magnetic field shielding sheet 114 may be disposed on one surface of the flat coils 111, 112 and 113 to shield the magnetic field generated by the wireless power signals induced in the flat coils 111, 112 and 113 and condense as a desired direction.

The magnetic field shielding sheet 114 may be a plate-shaped member having a predetermined area, and may be made of a material having magnetic properties so as to shield the magnetic field and to condense the magnetic field in a desired direction.

In this, the magnetic field shielding sheet 114 may be made of various known materials. For example, the magnetic field shielding sheet 114 may be a thin ribbon sheet, a ferrite sheet, or a polymer sheet including at least one of an amorphous alloy and a nanocrystalline alloy.

Here, the amorphous alloy may be a Fe-based or a Co-based magnetic alloy, and the ferrite sheet may be a sintered ferrite sheet containing at least one of Mn—Zn ferrite and Ni—Zn ferrite.

In addition, the magnetic field shielding sheet 114 may be flaked and divided into a plurality of layers, or may have a multi-layer structure.

Since the magnetic field shielding sheet 114 is a known structure, a detailed description thereof will be omitted, and it is noted that a material used as a shielding sheet may be any of conventionally known materials that are commonly used.

The heat-radiating cases 130 and 230 may be provided in a housing shape having an housing space for housing therein at least one circuit board 161 and 162 for controlling overall driving by electrically connecting to the flat coils 111, 112 and 113.

That is, the heat-radiating cases 130 and 230 may be provided in a housing shape having an upper opening space for housing the circuit boards 161 and 162. The wireless power transmission module may be fastened to the heat-radiating cases 130 and 230 via a fastening member 128 so as to be positioned on the upper side of the circuit board 160.

Here, the circuit boards 161 and 162 may be mounted with various circuit elements for controlling the overall driving, and may be provided in a plurality or one.

In addition, in the wireless power transmission device 100 according to the present invention, the housing-shaped cover 150 having one side opened is detachably coupled to the heat-radiating cases 130 and 230, so that the flat coils 111, 112, and 113 may be prevented to expose to the outside. For example, the heat-radiating cases 130 and 230 may have at least one latching protrusion 132 formed on the outer surface thereof. The cover 150 may be detachably coupled to the heat-radiating cases 130 and 230 by engaging the rim of the cover 150 with the latching protrusion 132.

The heat-radiating cases 130 and 230 may be made of a material having a high thermal conductivity so as to radiate heat generated from a heat source to the outside during driving.

Figure 4:
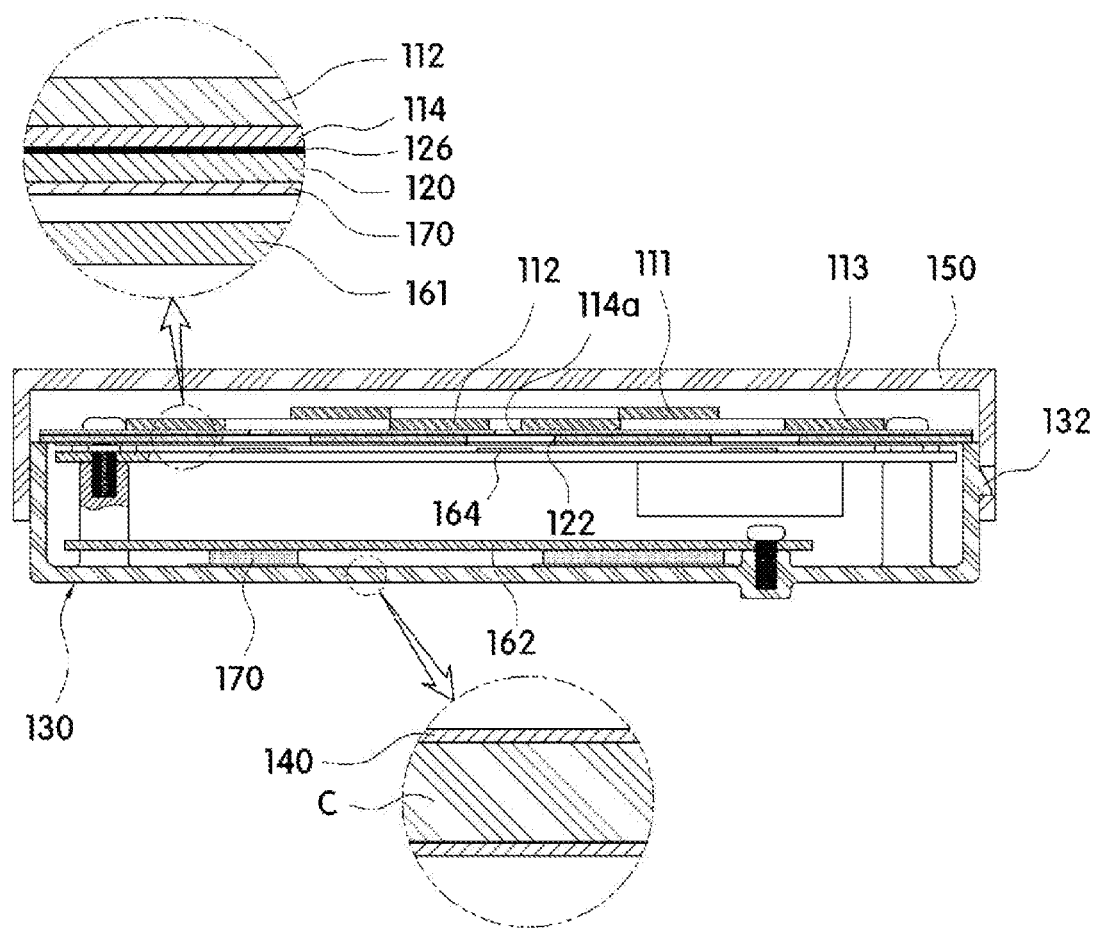
FIG. 4 is a cross-sectional view of FIG. 1.
Figure 6:
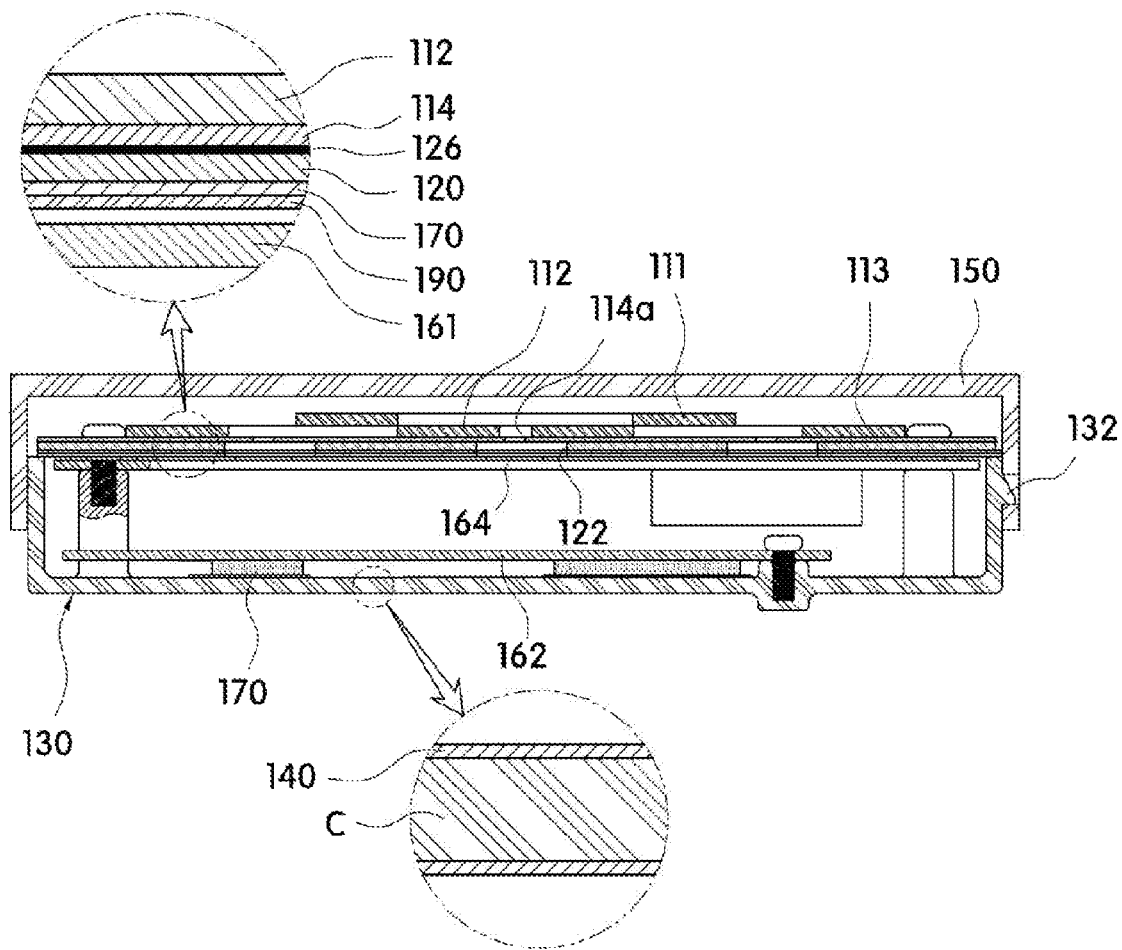
FIG. 6 is an assembled cross-sectional view of FIG. 5.
Figure 7:
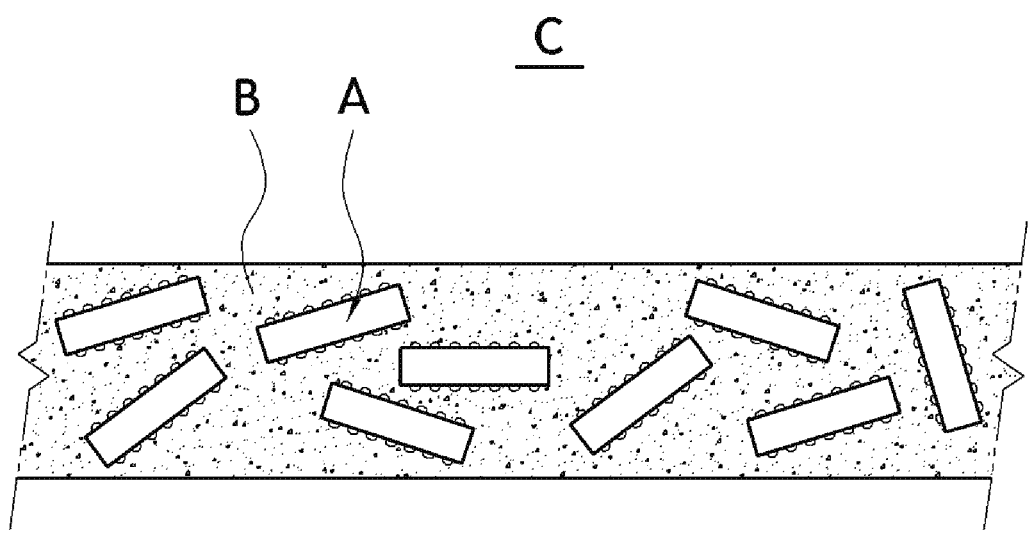
FIG. 7 is a schematic view showing a detailed configuration of a heat-radiating member forming composition implemented as a heat-radiating case in the wireless power transmission device for a vehicle according to the present invention.

For example, the heat-radiating cases 130 and 230 may be made of a metal such as copper or aluminum, and a plastic material using a radiating member forming composition C including the graphite composites A and A' (refer to FIGS. 4 and 6). The heat-radiating cases 130 and 230 may be a form in which a plate-like metal plate D such as copper or aluminum is integrated with the heat-radiating member forming composition C including the graphite composites A and A' through insert injection.

Figure 9:
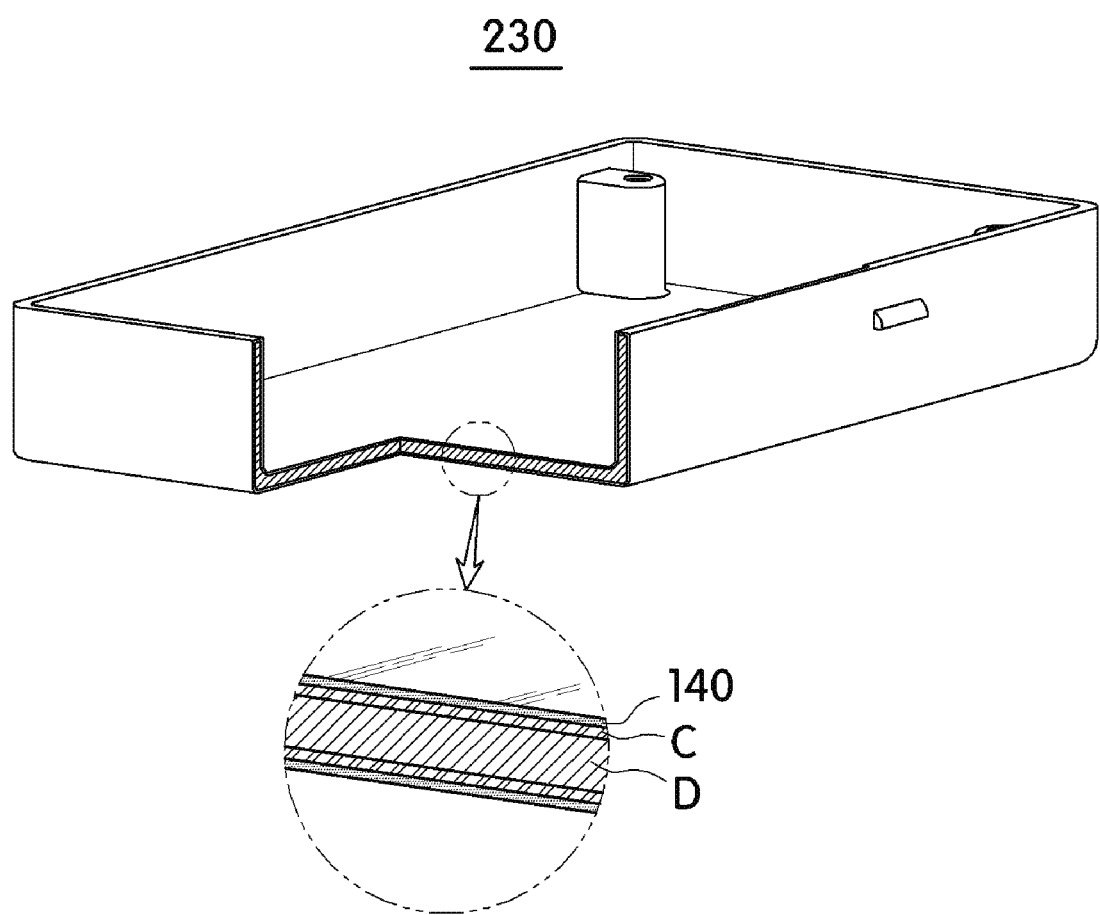
FIG. 9 is a partial cutaway view showing a case where the heat-radiating case applied to the present invention is realized by integrating a heat-radiating member forming composition and a metal plate.

The heat-radiating case 130 and 230 applied to the present invention may have excellent heat radiating properties so that the heat-radiating coating layer 140 may be formed on the surface of the cover 150 to further reduce the surface temperature of the cover 150 on which the electronic device requiring charging is placed (refer to FIGS. 4, 6, and 9).

That is, the heat-radiating coating layer 140 may be applied to the outer surface of the heat-radiating cases 130 and 230 to have a predetermined thickness to further increase the overall heat-radiating, thereby further lowering the surface temperature of the cover 150. The surface temperature of the cover 150 heated by the heat generated in the heat source during operation may further be lowered. Thus, even if the user's body touches the cover 150, it is possible to reduce the user's feeling of discomfort due to the high temperature.

For example, the heat-radiating coating layer 140 may include a coating layer forming component including a main resin, a carbon-based filler, and a physical property enhancing component for improving heat radiation and adhesion. The carbon-based filler may be included in an amount of 8 to 72 parts by weight based on 100 parts by weight of the main resin.

The coating layer forming component may further include a main resin, and when the main resin is a hardening resin, a hardening agent may further be included, and other hardening accelerators and a hardening catalyst may be further included.

The above-mentioned main resin may be capable of forming a coating layer and used without limitation in the case of components known in the art. In order to simultaneously achieve the adhesion with the heat radiating cases 130 and 230, the heat resistance not to be weaken by heat, the mechanical strength, and the improvement in the heat-radiating performance due to the improved compatibility with the carbon-filler, the main resin may be at least one selected from the group consisting of glycidyl ether type epoxy resin, glycidyl amine type epoxy resin, glycidyl ester type epoxy resin, linear aliphatic type epoxy resin, rubber modified epoxy resin and derivatives thereof epoxy resin.

Specifically, the glycidyl ether type epoxy resin may include a glycidyl ether of a phenol and a glycidyl ether of an alcohol. The glycidyl ether of the phenol may be a bisphenol-based epoxy such as bisphenol A type, bisphenol B type, bisphenol AD type, bisphenol S type, bisphenol F type and resorcinol, phenol novolac epoxy, Phenolic novolacs such as terpene phenol novolac, and cresol novolac epoxy resins such as o-cresol novolac epoxy, and may be used alone or in combination thereof.

The main resin may be a carbon-based filler, and particularly excellent in compatibility with carbon black. The main resin may be a glycidyl ether type epoxy resin including a bisphenol A type epoxy resin for improving heat-radiating characteristics, durability, and surface quality due to particularly excellent in compatibility with carbon black.

Here, the bisphenol A type epoxy resin may have an epoxy equivalent of 350 to 600 g/eq. When the epoxy equivalent is less than 350 g/eq, the hardness of the heat-radiating coating layer 140 may increase, so that cracks may easily occur or peeling may easily occur on the curved coating surface. When the epoxy equivalent is more than 600 g/eq, the chemical resistance, adhesion and durability may be deteriorated due to occurrence of unhardened portions.

The bisphenol A type epoxy resin may have a viscosity of 10 to 200 cps. when the viscosity of the bisphenol A type epoxy resin is less than 10 cps, it may be difficult to produce the heat-radiating coating layer 140, and even if the bisphenol-A epoxy resin is produced, the adhesion to the surfaces of the heat-radiating cases 130 and 230 may be reduced. On the other hand, when the viscosity of the bisphenol A type epoxy resin exceeds 200 cps, it is difficult to form the heat-radiating coating layer 140 to a thin thickness and the coating process may not be easy. Especially in the case of spray coating, the coating process may be more difficult. Also, the dispersibility of carbon black in the heat-radiating coating layer 140 may be deteriorated.

The hardening agent contained in the coating layer forming component together with the epoxy resin as the main resin may be varied depending on the specific type of the epoxy resin selected. The specific kind may be a hardening agent known in the art and preferably include at least one of an acid anhydride type, an amine type, an imidazole type, a polyamide type and a polymercaptan type.

Meanwhile, when the main resin contains a bisphenol A type epoxy resin, the coating layer forming component may further comprise a polyamide component as a hardening agent. This is advantageous in improving the compatibility with the carbon-based filler, particularly carbon black, and is advantageous in all physical properties such as adhesiveness, durability and surface quality of the heat-dissipating coating layer 140, There is an advantage that cracks are generated or peeled from the heat-radiating coating layer 140 formed on the outer surface of the case 130 or 230 when the outer surface of the case 130 is curved or a step is formed instead of a smooth surface.

In this case, the polyamide-based component may have an amine value of 180 to 300 mgKOH/g, more preferably 50,000 to 70,000 cps at 40° C. in order to exhibit further improved physical properties. When the amine value of the polyamide-based hardening agent is less than 180 mgKOH/g, the hardening quality may be deteriorated and the surface quality, durability and adhesiveness may be lowered, and the heat-radiating performance may be lowered. When the amine value is more than 300 mgKOH/g, the hardening may proceed rapidly, resulting in the aggregation of the coatings. When the viscosity of the polyamide-based curing agent is less than 50,000 cps, there may be a problem of flowing down after coating. When it exceeds 70,000 cps, the application may not be uniform during spray coating, and the nozzle may be clogged and aggregated.

When the main resin contained in the coating layer forming component is a bisphenol A type epoxy resin, the polyamide type hardening agent may be included in an amount of 45 to 75 parts by weight based on 100 parts by weight of the bisphenol A type epoxy resin. When the amount of the polyamide-based hardening agent is less than 45 parts by weight, there may be a problem of non-curing problems and durability deterioration. When the amount of the polyamide-based hardening agent is more than 75 parts by weight, there may be a problem of cracking due to excessive hardening.

When the carbon-based filler includes carbon, the carbon-based filler may be used without limitation, and a carbon-based material known in the art may be used. In addition, the shape and size of the carbon-based filler are not limited and may be porous or non-porous in structure, and may be selected depending on the purpose, but the present invention is not particularly limited thereto. For example, the carbon-based filler may be selected one or more species from the group consisting of carbon nanotubes such as single-walled carbon nanotubes, double-walled carbon nanotubes, and multi-walled carbon nanotubes, graphene, graphene oxide, graphite, carbon black. However, it may preferably contain at least one of graphite and carbon black to facilitate achievement of desired physical properties such as excellent heat-radiating performance, ease of formation of a coating layer, and surface quality of a coating layer. Carbon black may be used for improving the surface quality of the coating layer.

The carbon black may be selected from at least one kind of known carbon black such as furnace black, lamp black, and channel black, and may be used without limitation. However, the average particle diameter of the carbon black may be preferably 250 nm or less, more preferably 50 to 250 nm. When the average particle diameter of the carbon black exceeds 250 nm, the uniformity of the surface may be lowered. When the average particle diameter is less than 50 nm, the product unit price may increase, and the amount of carbon black that may be deposited on the surface of the coating layer may be increased to lower the heat-radiating performance.

In addition, for the surface quality of the heat-radiating coating layer 140, the carbon black may have a D90 of 260 nm or less in the volume cumulative particle size distribution. when the carbon black has a volume cumulative particle size distribution and D90 exceeds 260 nm, the surface quality of the heat-radiating coating layer 140 may be deteriorated.

Here, D90 means the particle diameter of the carbon black particles when the cumulative degree is 90% in the volume cumulative particle size distribution. Specifically, when the volume cumulative value (100%) of the whole particles was calculated from the smallest particle size to the volume cumulative value (%) based on the graph (volume particle size distribution), the particle size of 90% corresponds to D90. The volume cumulative particle size distribution of the carbon black may be measured using a laser diffraction scattering particle size distribution device.

In the case of the carbon-based filler, a carbon-based filler whose surface is modified with functional groups such as a silane group, an amino group, an amine group, a hydroxyl group and a carboxyl group can be used. The functional group may be directly bonded to the surface of the carbon-based filler, indirectly bonded to the carbon-based filler through a substituted or unsubstituted aliphatic hydrocarbon having 1 to 20 carbon atoms or a substituted or unsubstituted aromatic hydrocarbon having 6 to 14 carbon atoms.

In addition, the carbon-based material may be a core or a shell, and the different material may be a core-shell type filler constituting a shell or a core.

The carbon-based filler may be included in an amount of 8 to 72 parts by weight with respect to 100 parts by weight of the main resin. The carbon-based filler may be included in an amount of 17 to 42 parts by weight for better physical properties When the carbon-based filler is contained in an amount of less than 8 parts by weight based on 100 parts by weight of the main resin, the desired heat-radiating performance may not be exhibited. When the carbon-based filler is more than 72 parts by weight based on 100 parts by weight of the main resin, the adhesion of the heat-radiating coating layer 140 may be weakened and peeling may easily occur. As the carbon-based filler protruded on the surface of the heat-dissipating coating layer 140 increases, the surface roughness may increase and the surface quality of the heat-radiating coating layer 140 may be deteriorated.

On the other hand, the carbon-based filler may be included in an amount of not more than 42 parts by weight based on 100 parts by weight of the main resin. When the carbon-based filler exceeds 42 parts by weight with respect to 100 parts by weight of the main resin, in order to realize the thin heat-radiating coating layer 140, the heat-radiating coating layer may be applied to the heat-radiating cases 130 and 230, It is difficult for the composition to be uniformly applied during coating by the spraying method. This is because the dispersibility of the carbon-based filler dispersed in the composition is lowered, and even if the dispersion is applied to the heat-radiating cases 130 and 230, the carbon-based filler may be non-uniformly dispersed, thereby causing a problem that the heat-radiating coating layer 140 is not exhibit uniform heat-radiating performance as a whole.

When the heat-radiating coating composition according to the present invention is coated on the heat-radiating cases 130 and 230, the physical property enhancing component may exhibit improved heat-radiating properties and exhibit excellent adhesiveness to improve durability.

The physical property enhancing component may be a silane compound, and known silane compounds employed in the art may be used without limitation. When used together with carbon black among the main resin and carbon-based filler of the above-described coating layer forming component, the silane compound may be at least one selected from the group consisting of 3-(N-anil-N-glycidyl) aminopropyltrimethoxysilane, 3-glycidoxypropylmethylethoxysilane, gamma-glycidoxytrimethyldimethoxysilane, Glycidoxypropyltrimethoxysilane, 3-glycidoxypropyltrimethoxysilane, 3-glycidoxypropyltrimethoxysilane, 3-glycidoxypropyltrimethoxysilane, 3-glycidoxypropylmethylmethoxysilane, and 3-glycidoxypropylmethyldimethoxysilane.

The physical property enhancing component may be included in an amount of 2 to 5 parts by weight based on 100 parts by weight of the main resin. When the physical property enhancing component is provided in an amount of less than 2 parts by weight based on 100 parts by weight of the main resin, desired physical properties such as heat-radiating through the physical property enhancing component and adhesiveness improvement may not be achieved simultaneously. When the amount is more than 5 parts by weight based on 100 parts by weight of the main resin, adhesion with the surfaces of the heat-radiating cases 130 and 230 may be weakened.

The heat-radiating coating layer 140 may further include a dispersant and a solvent for improving the dispersibility of the carbon-based filler. The dispersant may be a known component employed in the art as a dispersant for a carbon-based filler.

In addition, the heat-radiating coating layer 140 may include a leveling agent, a pH adjuster, an ion scavenger, a viscosity adjuster, a thixotropic agent, an antioxidant, a heat stabilizer, a light stabilizer, an ultraviolet absorber, a colorant, a dehydrating agent, antistatic agent, anti-fogging agent, preservative, and the like may be added. The various additives described above may be those well known in the art and are not particularly limited in the present invention.

The heat-radiating coating layer 140 may have a viscosity of 50 to 250 cps at 25° C. When the viscosity of the heat-radiating coating layer 140 is less than 50 cps, it may be difficult to generate the heat-radiating coating layer 140 by flowing down from the coated surface during the coating process. Further, the adhesion to the coated surface may be weakened even after the production. When the viscosity of the heat-radiating coating layer 140 exceeds 250 cps, it is difficult to produce a thin coating layer. In addition, even if it is produced, the surface may not be uniform, and the coating process may not be easy. Particularly, in the case of the spraying type coating, the coating process may be further difficult and the dispersibility of the carbon black in the heat-radiating coating layer may be deteriorated.

The heat-radiating coating layer 140 may include 5 to 30% by weight of a carbon-based filler based on the total weight of the heat-radiating coating layer. When the carbon-based filler is contained in the heat-radiating coating layer 140 in an amount of less than 5% by weight, heat-radiating performance of a desired level may not be exhibited. When the carbon-based filler is contained in the heat-radiating coating layer 140 in an amount of more than 30% by weight, the adhesion of the heat-radiating coating layer 140 may be weakened and peeling may easily occur, and the hardness of the coating layer may increase. Further, as the number of the carbon-based fillers protruded on the surface of the heat-radiating coating layer 140 increases, the surface roughness may increase and the surface quality of the heat-radiating coating layer may be deteriorated.

In the case where the heat-radiating cases 130 and 230 include a plastic material using the heat-radiating member forming composition C, the heat-radiating member forming composition C may include the graphite composites A and A' and a polymer resin B. also, the heat dissipation case 130 and 230 may be realized through hardening after insert injection molding.

That is, the heat-radiating cases 130 and 230 include a heat-radiating member forming composition including graphite having a good thermal conductivity, so that the thermal conductivity may be greatly improved, and excellent heat radiation performance may be realized.

The graphite composite A and A' may be formed of a composite in which the nanometer metal particles A2 are bonded to the surface of the graphite sheet A1. The nano metal particles A2 may be a conductive metal so as to exhibit an electromagnetic wave shielding effect. For example, the nano metal particles A2 may include at least one selected from the group consisting of Ni, Si, Ti, Cr, Mn, Fe, Co, Cu, Sn, In, Pt, Au and Mg.

Here, the nano metal particles A2 contained in the graphite composites A and A' may be present at a high density on the surface of the graphite sheet A1 and therefore the nanometer metal particles A2 may be contained in an amount of 20 to 50 wt % based on the total weight of the graphite A1 and bonded to the graphite A1 surface in a crystalline form having an average particle size of 10 to 200 nm. Further, the graphite composite A and A' may have a surface area range of 30 to 70 area % with respect to the cross section of the graphite composite A and A'.

Here, the composition for forming a heat-radiating member may form a dispersed phase in the polymer resin B by the graphite composite A and A'. Here, the polymer resin B may include at least one of a thermosetting resin and a thermoplastic resin.

For this purpose, the graphite composite A and A' may include a catecholamine layer A3 on the nano-metal particles A2. The surface of the plate-like graphite A1 in which the nano-sized metal particles A2 are crystallized on the surface thereof may be coated with catecholamine such as polydodamine. This is because the strong interfacial bonding with the polymer resin may be improved by utilizing the strong adhesive property of the catecholamine without deteriorating the inherent physical properties of the graphite itself in the plate form.

Further, when the catecholamine layer A3 is coated on the nano-sized metal particles (A2), the dispersibility in the organic solvent may be improved. When the heat-radiating member forming composition C contains an organic solvent, the graphite composite A or A' may be uniformly dispersed in the polymer resin B.

Accordingly, a graphite composite A or A' containing graphite-nano metal particles-catecholamines may be preferentially produced, so that the composite material may be produced in which the dispersibility in a desired polymer resin is remarkably improved.

The term "catecholamine" as used herein means a single molecule having various alkylamines as a para-group having a hydroxy group (—OH) as an ortho-group of a benzene ring. Various derivatives of these structures may include dopamine, dopamine-quinone, alphamethyldopamine, norepinephrine, epinephrine, alphamethyldopa, Droxidopa, indolamine, serotonin or 5-hydroxydopamine are included in catecholamines. Most preferably, dopamine may be used.

Typically, the catecholamine layer may be difficult to coat on the surface of the graphite plate on a pure plate. However, in the graphite composites A and A' applied to the present invention, the nanometallic particles A2 crystallized on the surface may be bonded at a high density. The catecholamine layer A3 may be stably formed by bonding a catecholamine compound such as polydodamine to the crystallized nano-material particles A2.

When the catecholamine layer is composed of dopamine, the catecholamine layer may be formed by dipping the graphite composite A or A' into a dopamine aqueous solution. At this time, when an aqueous solution of basic dopamine is used as the dopamine aqueous solution, dopamine reacts spontaneously under oxidizing conditions to polymerize the nano-metal particles A2 of the graphite composite A or A' to form a poly-dopamine layer. Therefore, a separate firing process may be not required, and the addition of the oxidizing agent may be not particularly limited. Oxygen gas in the air may be used as an oxidizing agent without adding an oxidizing agent.

As described above, since the graphite composite A or A' applied to the present invention has the nanometer-sized metal particles A2 bonded to the surface of the graphite, the catecholamine layer may be formed by the nanometer-sized metal particles A2.

Thus, the interfacial characteristics between the polymer resin B and the graphite composite A or A' may be improved through the catecholamine layer. Accordingly, the dispersibility of the graphite composite A or A' may be improved and the orientation property is improved. The content of the graphite composite contained in the heat-radiating member-forming composition may be increased, and the sheet may be produced even if a small amount of the polymer resin is contained in the heat radiating member-forming composition.

Figure 8A:
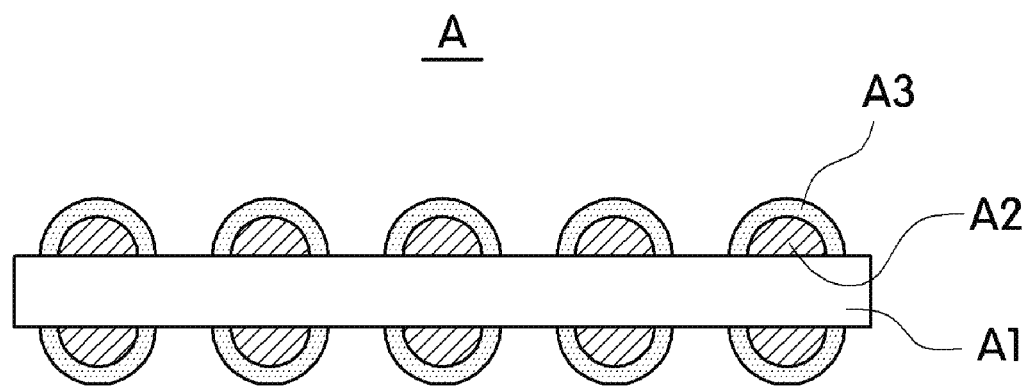
Figure 8B:
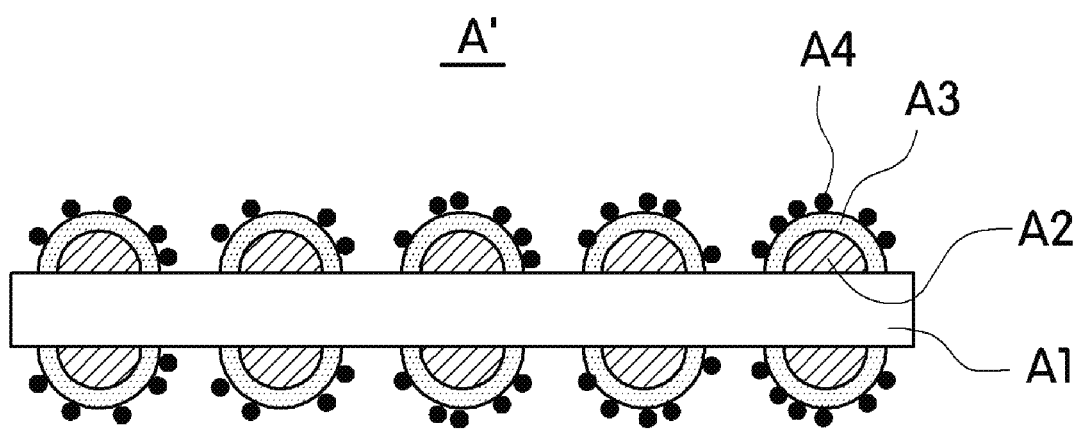

Meanwhile, the graphite composite A' may include a polymer A4 bonded on the catecholamine layer A3 (refer to FIG. 8B). For example, the graphite composite A coated with the nano-metal particles A2 with the catecholamine may be added to the polymer resin solution to bind the polymer A4 on the catecholamine layer.

The polymer A4 may be formed so as to completely cover the catecholamine layer A3 or the polymer A4 may be bonded to the catecholamine layer A3 in the form of particles and the surface of the graphite composite A.

In addition, the polymer A4 may be not particularly limited to its kind but may be selected from the group consisting of thermosetting resin, thermoplastic resin and rubber. At this time, if the polymer A4 has reactivity and compatibility with the polymer resin B constituting the heat releasing member forming composition, there is no particular limitation on its kind, but it is preferably the same as the type of the polymer resin B, a similar type of polymer may be used.

After the graphite composite A' containing the graphite A1, the nano metal particles A2, the catecholamine layer A3 and the polymer A4, the graphite composite A' may be uniformly dispersed in the polymer resin B by dispersing the polymer in the polymer resin B.

That is, the graphite composite A' may contain a polymer A4 on its surface. Accordingly, the low dispersibility and aggregation of the graphite itself do not occur, and the aggregation due to the high tackiness of the catecholamine layer itself does not occur, so that uniform dispersion may be achieved in the polymer resin. Thus, the total amount of the graphite composite A' may be increased in constituting the heat radiating member-forming composition, thereby obtaining excellent heat radiation performance.

The heat radiating member forming composition may contain, in addition to an organic solvent, a leveling agent, a pH adjusting agent, an ion scavenger, a viscosity adjusting agent, a thixotropic agent, an antioxidant, a heat stabilizer, a light stabilizer, a dehydrating agent, a flame retardant, an antistatic agent, a antifungal agent, a preservative, and the like may be added. The various additives described above may be those well known in the art and are not particularly limited in the present invention. The catecholamine layer A3 may further include a solvent, and a solvent suitable for the catecholamine layer A3 may be selected according to the selected adhesive component. Therefore, the catecholamine layer A3 is not particularly limited in the present invention. As the solvent, any solvent which enables proper dissolution of each component may be used When the heat-radiating case 130 or 230 according to the present invention is implemented as the heat-radiating member-forming composition in which the graphite composite A or A' and the polymer resin B are mixed, only the heat-radiating case 130 or 230, or may be realized by integrating the heat-radiating member forming composition with the metal plate D by covering the metal plate D through insert injection. As a result, the heat-radiating performance may be improved even when the heat-radiating cases 130 and 230 having the same size as the heat-radiating cases 130 and 230 are made of only a metal material. In addition, it is possible to reduce the weight.

Meanwhile, the wireless power transmission device for the vehicle 100 according to the present invention may further include a plate-shaped heat-radiating plate 120. The heat-radiating plate 120 may be a plate-like member having a predetermined area and may be disposed on one side of the magnetic field shielding sheet 114. The heat-radiating plate 120 may be fastened to the heat-radiating cases 130 and 230 through a fastening member 128 such as a bolt member.

Here, the heat-radiating plate 120 may be attached to one surface of the magnetic field shielding sheet 114 via an adhesive layer 126 including a thermally conductive component. The heat-radiating plate 120 may have at least one through hole 127 through which the fastening member 128 passes.

In addition, the heat-radiating plate 120 may be made of a metal material having excellent thermal conductivity such as copper or aluminum. The magnetic field shielding sheet 114 may serve as a support for supporting the magnetic field shielding sheet 114 and to disperse heat generated from the flat coils 111, 112 and 113 fixed on one surface of the magnetic field shielding sheet 114.

That is, the magnetic field shielding sheet 114 may have a weak strength such as a ferrite sheet or a polymer sheet. Even if it is formed in a flexible sheet form, it may be supported by the heat-radiating plate 120 made of a metal material having a predetermined strength, so that assembling property and fastening property may be improved when assembled with the heat radiating cases 130 and 230.

In addition, heat generated from the flat type coils 111, 112, and 113 may be transmitted to the heat-radiating plate 120 through the magnetic field shielding sheet 114 and then dispersed. Therefore, the heat exchange temperature of the air existing between the flat coils 111, 112, 113 and the cover 150 may be lowered. As a result, the amount of heat transmitted to the cover 150 side through the air may be reduced, and consequently, the surface temperature of the cover 150 may be lowered.

At this time, a plate-shaped insulating member 170 may be disposed on at least one surface of the heat-radiating plate 120 (refer to FIGS. 4 and 6). That is, the insulating member 170 may be disposed between the heat radiating plate 120 and the circuit board 161 embedded in the heat radiating cases 130 and 230, thereby electrically connecting the heat radiating plate 120 and the circuit board 161 to be insulated. Accordingly, even if the heat-radiating plate 120 is made of a metal material, electrical short-circuiting with the circuit board 161 may be prevented through the insulating member 170, thereby enhancing stability and reliability of the product. Here, the insulating member 170 may be made of a fluororesin-based film such as PET.

Figure 3:
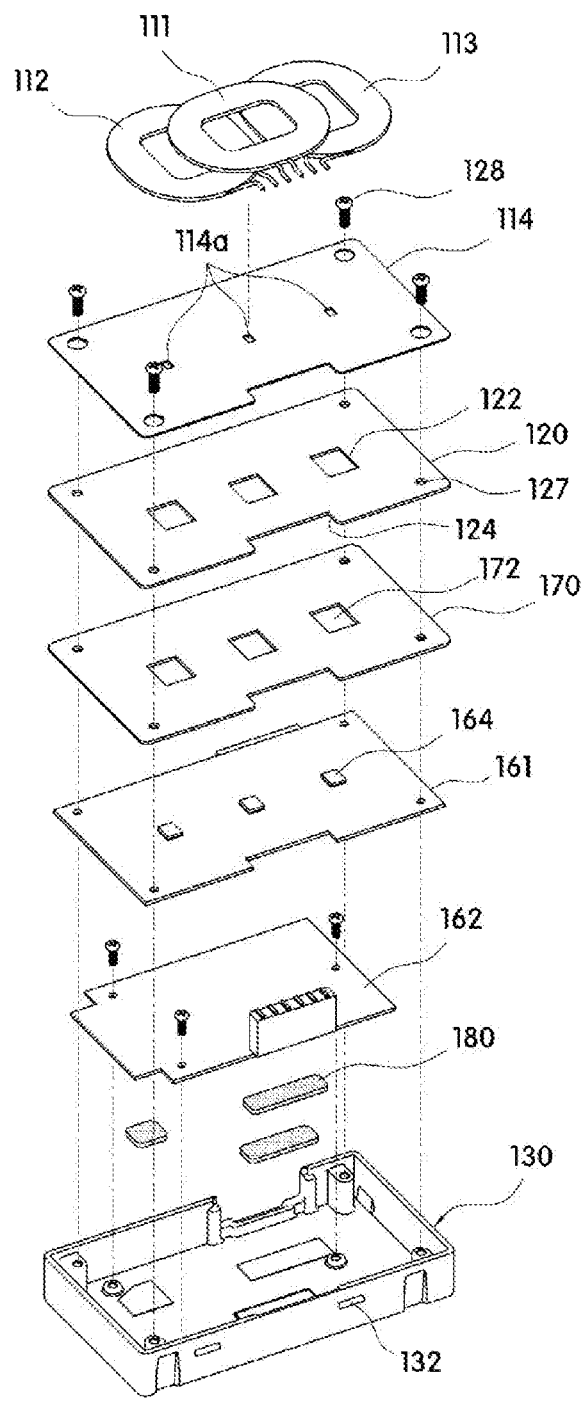
FIG. 3 is an exploded view of FIG. 3.
Figure 5:
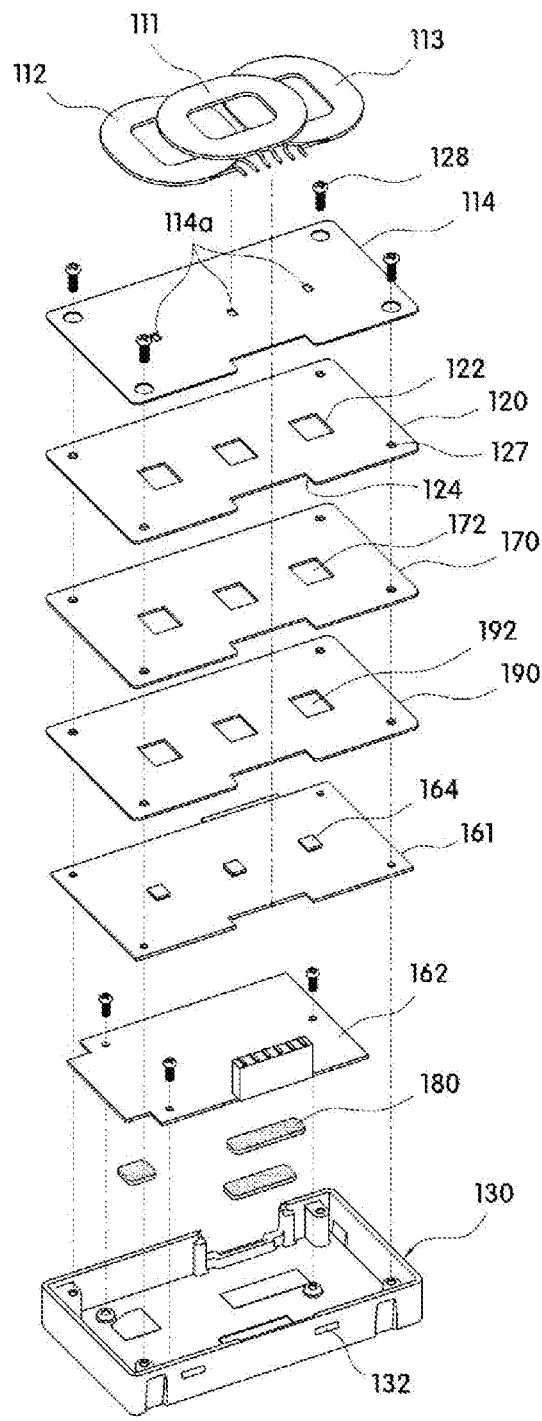
FIG. 5 is an exploded view of a wireless power transmission device according to another embodiment of the present invention.

As shown in FIGS. 3 and 4, the heat-radiating plate 120 may be disposed such that at least a portion of the heat-radiating plate 120 is in contact with the heat-radiating cases 130 and 230 when the heat-radiating plate 120 is coupled with the heat-radiating cases 130 and 230. For example, the heat-radiating plate 120 has a relatively larger area than the upper edges of the heat radiating cases 130 and 230 so that the rim of the heat-radiating plate 120 is in contact with the upper rim of the heat-radiating cases 130 and 230. The heat generated by the flat coils 111, 112 and 113 may be dispersed in the heat-radiating plate 120, then transmitted to the heat-radiating cases 130 and 230 and transmitted to the cover 150 by being discharged by the heat-radiating cases 130 and 230, so that the amount of heat is further reduced As another example, a separate heat insulating layer 190 may be disposed between the insulating member 170 and the circuit board 161, as shown in FIGS. 5 and 6. The heat insulating layer 190 may prevent the heat generated from the circuit board built in the heat-radiating cases 130 and 230 from being conducted to the heat-radiating plate 120 side. Accordingly, the heat generated from the circuit board may be transferred only to the heat-radiating cases 130 and 230 through conduction and convection.

Therefore, the air heated by the heat generated by the flat coils 111, 112, 113 and the heat during operation may flow only inside the cover 150. The heat generated on the circuit board side and the air heated by the heat may be flowed only inside the heat-radiating case 130 and 230.

Accordingly, even if the heat generated on the circuit board side is relatively higher in temperature than the heat generated in the flat coils 111, 112, and 113, the influence that the temperature rises of the cover 150 may be minimized or prevented. Thus, it is possible to prevent the surface temperature of the cover 150 from being raised by the heat generated in the circuit board.

For this, the heat insulating layer 190 may be a sheet-like plate or film-type, or may be a coating layer coated on at least one surface of the insulating member 170.

As a specific example, the heat insulating layer 190 may be a heat insulating sheet containing hollow silica particles or a nanofiber web formed to have micropores through nanofibers made of a polymer resin. The heat insulating layer 190 may be a coating layer coated with a heat reflecting material on at least one surface of the insulating member 170.

However, it should be noted that the heat insulating layer 190 is not limited thereto, and any known heat insulating material or heat insulating sheet used for heat insulating purposes may be used.

The heat-radiating plate 120 may be connected to the circuit board 162 through connection terminals 111a, 112a, and 113a extending from the flat coils 111, 112, and 113, respectively. Thus, at least one opening 124 drawn inwardly from the rim may be formed.

The connection terminals 111a, 112a and 113a protruding toward the opening 124 may be connected to the circuit board 162 while the wireless power transmission module including the heat-radiating plate 120 is fixed to the heat-radiating cases 130 and 230.

The magnetic field shielding sheet 114 and the heat-radiating plate 120 may have at least one through hole 114a and a through hole 122 formed therein, respectively. That is, the magnetic field shielding sheet 114 may include at least one first passage hole 114a formed through a predetermined area. The heat radiating plate 120 may include a second passage hole 122 formed at a position corresponding to the first passage hole 114a.

The first passage hole 114a and the second passage hole 122 may serve as passages for moving the air around the flat coils 111, 112 and 113 to the circuit board 161 side embedded in the heat-radiating cases 130 and 230.

Here, a temperature sensor 164 such as a thermistor may be disposed on the circuit board 161 side in a region corresponding to the second through hole 122. When the temperature sensor 164 protrudes from the circuit board 161 at a predetermined height, the second through hole 122 may also serve as a placement hole for receiving the temperature sensor 164. In this case, the second passage hole 122 may have a relatively larger area than the temperature sensor 164, so that the temperature sensor 164 is not in contact with the heat-radiating plate 120.

Thus, the air having heat-exchanged with the heat generated in the flat coils 111, 112, 113 during the operation of the wireless power transmission module may flow into the temperature sensor 164 side to detect the temperature of the heat generated in the flat coils 111, 112 and 113. When the temperature of the flat coils 111, 112, and 113 exceeds a predetermined value, it is possible to prevent the occurrence of various problems such as breakage of the electronic parts due to overheating by stopping the entire operation.

Here, the insulating member 170 is disposed between the heat-radiating plate 120 and the circuit board 161. When the heat insulating layer 190 in the form of a sheet is disposed along with the insulating member 170, the insulating member 170 and the heat insulating layer 190 also may have separate through holes 172 and 192 corresponding to the second through holes 122 respectively.

At this case, the first passage hole 114a may be formed in a region corresponding to the hollow portion of the flat coils 111, 112 and 113. This is because air around the flat coils 111, 112, and 113 may flow smoothly into the first passage hole 114a by preventing the first passage hole 114a from overlapping with the pattern portions of the flat coils 111, 112 and 113.

Meanwhile, in the wireless power transmission device for the vehicle 100 according to the present invention, the heat transfer member 180 may be disposed on the bottom surface of the heat-radiating cases 130 and 230

The heat transfer member 180 may be disposed in contact with the bottom surface of the heat-radiating case 130 or 230 and the surface of the circuit board 162 disposed inside the heat radiation case 130 or 230, respectively. Accordingly, the heat generated in the circuit board 162 may be transmitted to the heat-radiating cases 130 and 230 through the heat transfer member 180.

For example, the heat transfer member 180 may be disposed in a region corresponding to a heat generating element such as an IC chip mounted on the circuit board 162. Therefore, the heat generated in the heat generating element may be transmitted to the heat-radiating cases 130 and 230.

At this time, the heat transfer member 180 may have a thermal conductivity of 0.8 W/m·K or more. This is because when the thermal conductivity of the heat transfer member 180 is less than 0.8 W/m·K, the heat radiation effect may be insignificant and the wireless charging efficiency may be lowered.

The heat transfer member 180 may be formed in a shape of a pad of the heat-radiating case 130 or 230. The heat transfer member 180 may be formed in a shape of a pad having a heat radiating forming composition including at least one of a thermally conductive filler and a phase change material. The heat radiation forming composition comprising at least one of a phase change compounds and a thermally conductive filler may be directly applied to a bottom surface to a predetermined thickness to be solidified In this case, when the heat transfer member 180 is formed of a heat-radiating forming composition including a thermally conductive filler, the thermally conductive filler may include at least one of metal fillers, a ceramic filler, and a carbon filler.

The metal filler may be at least one selected from the group consisting of Al, Ag, Cu, NI, In—Bi—Sn alloy, Sn—In—Zn alloy, Sn—In—Ag alloy, Sn—Ag—Bi alloy, Sn—Bi—Cu—Ag alloy, Sn—Ag—Cu—Sb alloy, a Sn—Ag—Cu alloy, a Sn—Ag alloy, and a Sn—Ag—Cu—Zn alloy. The ceramic filler may include at least one of known ceramic fillers such as AlN, Al2O3, BN, SiC, and BeO. The carbon-based filler may include one or more known carbon-based fillers such as graphite, carbon nanotube, carbon fiber, diamond and graphene.

Here, when the heat transfer member 180 is formed of the heat-radiating forming composition including a thermally conductive filler, the heat transfer member 180 may further include a conventional coating layer forming component and a hardening component which are generally used.

In the case where the heat-radiating member forming the heat transfer member 180 includes a phase change compound, the heat transfer member 180 may have a structure in which the property changes from a solid state to a semi-solid state or a liquid state due to heat generated in the heat generating element.

In other words, the heat that absorbs or releases when a substance changes phase, for example, from solid to liquid (or liquid to solid), liquid to gas (or gas to liquid) may be called latent heat. Since the latent heat is much larger than the heat absorbed (or discharged) according to the temperature change in the state where no phase change occurs, when the latent heat is used, it may be advantageous to achieve a remarkable heat radiation effect.

Herein, the above phase-change compound may be a known phase-change compound. For example, the phase-change compound may include at least one member selected from the group consisting of linear aliphatic hydrocarbons, hydrated inorganic salts, polyhydric alcohols, higher fatty acids, alcohol fatty acid esters, and polyether.

As described above, the wireless power transmission device for a vehicle 100 according to the present invention forms the heat-radiating coating layer 140 on the outer surface of the heat-radiating cases 130 and 230. Here, by disposing the heat-radiating plate 120 made of a metal material on one surface of the magnetic field shielding sheet 114, the heat generation temperature on the exposed surface of the cover 150 may be lowered.

This may be confirmed in Table 1 below.

Table 1 shows the relationship between the material of the heat-radiating cases 130 and 230 and the outer surface of the heat-radiating cases 130 and 230 in a state where the heat radiating coating layer 140 is coated on the outer surface of the heat-radiating cases 130 and 230 in a state where the heat-radiating plate 120 made of aluminum is disposed on one surface of the magnetic field shielding sheet 114 and the temperature of the heat generated on the exposed surface of the cover 150 is measured.

TABLE 1

| Material of heat-radiating case | Weight (g) | Existence of heat-radiating coating layer | Surface temperature of cover (° C.) |
|---|---|---|---|
| Aluminum | 75.2 | x | 41.0 |
| | | 0 | 40.1 |
| Heat-radiating member forming composition | 50.8 | x | 40.5 |
| | | 0 | 40.3 |
| Composition of heat-radiating material + aluminum plate | 66.0 | x | 40.5 |
| | | 0 | 40.1 |

As can be seen from Table 1, when the heat-radiating coating layer 140 is formed on the outer surface of the heat-radiating cases 130 and 230 irrespective of the material of the heat-radiating case, the surface temperatures of the cover 150 are all reduced. When the heat radiating cases 130 and 230 are implemented with the heat radiation member forming composition described above, it is confirmed that the surface temperature of the cover 150 is reduced as compared with the heat radiation cases 130 and 230 made of aluminum alone as well as weight reduction.

Here, the heat-radiating member forming composition means a plastic material including the graphite composites A and A' as described above. The heat-radiating member forming composition+aluminum plate means a form in which the aluminum plate is integrated with the heat-radiating member forming composition C containing the graphite composites A and A' through insert injection.

The heat-radiating coating layer applied to the present invention will be described in more detail with reference to the following examples. The following embodiments are not intended to limit the scope of the heat-radiating coating layer applied to the present invention, and should be construed to facilitate understanding of the present invention.

Exemplary Example 1

65 parts by weight of a polyamide curing agent (Kukdo Chemical, G-5022) was added to 100 parts by weight of a bisphenol A type epoxy resin (YD-011) having an epoxy equivalent of 550 g/22 parts by weight of carbon black having an average particle diameter of 150 nm and D90 of 190 nm, 3 parts by weight of a physical property enhancing component (Shanghai Tech Polymer Technology, Tech-7130) as an epoxy silane compound, 3 parts by weight of a dispersant (a mixture of isobutylaldehyde and urea 18 parts by weight of water), 18 parts by weight of methyl ethyl ketone, 28.8 parts by weight of toluene, and 285 parts by weight of cyclohexanone were mixed and stirred. After stirring, the bubbles contained in the mixture were removed and the final viscosity was adjusted to 100 to 130 cps based on 25° C. to prepare a heat radiation coating composition as shown in Table 2, and then stored at 5° C.

Exemplary Examples 2 to 20

Table 2, Table 3, or Table 4 were prepared by changing the kind, average particle size, particle size distribution, and kind of the coating layer forming component of the carbon-based filler as shown in Table 2, Table 3 or Table 4 was prepared.

Comparative Examples 1 to 4

The heat-radiating coating composition as shown in Table 5 was prepared by changing the content of the carbon-based filler and the kind of the heat-radiating filler as shown in Table 5 below.

Experimental Example

The heat-radiating coating compositions prepared in exemplary Examples and Comparative Examples were applied by spray coating to a thickness of 25 μm on the entire surface of a substrate made of an aluminum material (Al1050) having both sides bent in an upward direction, followed by heat treatment at a temperature of 10 minutes to form the heat radiating coating layer. The physical properties of the substrate on which the heat-radiating coating layer was formed were evaluated and shown in Tables 2 to 5 below.

1. Thermal Radiation Evaluation

A substrate having a heat-radiating coating layer formed on the center of an acrylic chamber having a size of 30 cm×30 cm×30 cm horizontally, vertically and horizontally was placed, and the temperature inside the chamber and the temperature of the substrate on which the heat-radiating coating layer was formed were adjusted to 25±0.2° C. Then, a test piece was prepared by adhering a heat source (a copper block with a ceramic heater) to a substrate on which the heat-radiating coating layer was formed, using a TIM (thermally conductive tape: 1 W/mk). A constant current was applied to the heat source of the manufactured specimen to generate heat, and after maintaining the temperature for 1 hour, the temperature of the substrate on which the heat-radiating coating layer was formed was measured to evaluate the heat-radiating rate. Specifically, the heat-radiating rate was calculated in accordance with the following formula based on the temperature measured under the same conditions for the substrate having no heat-radiating coating layer.

Heat-radiating rate (%)={1−(temperature of test specimen (° C.)/temperature of uncoated substrate (° C.))}×100 <Equation>

However, in the case of Exemplary Example 13 and Comparative Example 2, durability and adhesion were evaluated as poor, and the radioactive evaluation was omitted.

2. Evaluation of Uniformity of Heat-Radiating Performance

A substrate having a heat dissipation coating layer formed on the center of an acrylic chamber having a size of 30 cm×30 cm×30 cm horizontally, vertically and vertically was placed, and then the temperature inside the chamber and the temperature of the substrate on which the heat-radiating coating layer was formed were adjusted to 25±0.2° C.

After a heat source having a diameter of 15 mm, a thickness of 1.5 mm and a temperature of 115° C. was directly brought into contact with the lower surface of the lower surface of the substrate having the heat radiation coating layer formed, The temperatures at four points of the bending point of the end of the substrate having the heat-radiating coating layer on the extension line of the diagonal line in the center were continuously measured. The time required for the temperature of each of the four points to rise by 10° C. was measured in seconds, and the standard deviation of the four points was calculated. The smaller the standard deviation is, the more uniform the heat-radiating performance can be seen, and it can be interpreted that the dispersibility of the carbon-based filler in the heat-radiating coating layer is high:

3. Durability Evaluation

After the substrate having the heat-radiating coating layer in the chamber having the temperature of 60° C. and the relative humidity of 90% was placed, after 480 hours passed, the surface condition of the substrate on which the heat-radiating coating layer was formed was visually evaluated. As a result of evaluation, in case that absence of cracking or peeling of the heat-radiating coating layer was checked by ○, and in case that presence of cracking or peeling of the heat-radiating coating layer was checked by x.

4. Adhesion Evaluation

Cross-cuts were performed with a knife so that the specimens having the durability were evaluated at intervals of 1 mm. Then, the scratched tape is attached to the cut surface and pulled at an angle of 60° to check the state of peeling off the coating layer. Evaluation criteria were evaluated according to ISO 2409. (5B: 0%, 4B: 5% or less, 3B: 5-15%, 2B: 15-35%, 1B: 35-65%, 0B: 65% or more)

5. Surface Quality Evaluation

In order to confirm the surface quality of the substrate on which the heat-radiating coating layer is formed, it was checked whether it was rugged or rough by touching the surface with a hand. When feeling smooth, it was expressed 5. When the area of the rough feeling portion is 2% or less of the total area of the outer surface of the substrate on which the heat radiation coating layer is formed, it was expressed 4. When the area exceeds 2% but less than 5%, it was expressed 3. When the area exceeds 5% but less than 10%, it was expressed 2. When the area exceeds 10% but less than 20%, it was expressed 1. When the area exceeds 20%, it was expressed 0.

TABLE 2

| | | Exemplary example 1 | Exemplary example 2 | Exemplary example 3 | Exemplary example 4 | Exemplary example 5 | Exemplary example 6 | Exemplary example 7 |
|---|---|---|---|---|---|---|---|---|
| Coating layer forming component | Main resin (type/epoxy equivalent (g/eq)/content (parts by weight)) | BPA(YD-011)/550/100 | BPA(YD-011)/550/100 | BPA(YD-011)/550/100 | BPA(YD-011)/550/100 | BPA(YD-011)/550/100 | BPA(YD-011)/550/100 | BPA(YD-011)/550/100 |
| | Hardening Agent (kind/amine value (mgKOH/g)/content (parts by weight)) | PA(G-5022)/220/65 | PA(G-5022)/220/65 | PA(G-5022)/220/65 | PA(G-5022)/220/65 | PA(G-5022)/220/65 | PA(G-5022)/220/65 | PA(G-5022)/220/65 |
| Carbon-based filler | Type/content (parts by weight) | Carbon black/22 | Carbon black/10 | Carbon black/15 | Carbon black/18 | Carbon black/40 | Carbon black/45 | Carbon black/68 |
| | Average particle diameter (nm)/D90 (nm) | 150/192 | 150/192 | 150/192 | 150/192 | 150/192 | 150/192 | 150/192 |
| Property enhancing component (parts by weight) | | 3 | 3 | 3 | 3 | 3 | 3 | 3 |
| The substrate on which the heat radiation coating layer is formed | Coating layer thickness (μm) | 25 | 25 | 25 | 25 | 25 | 25 | 25 |
| | Heat radiation (%) | 14.53 | 12.35 | 13.55 | 14.04 | 14.53 | 14.53 | 14.65 |
| | Radiation performance uniformity | 0.07 | 0.07 | 0.08 | 0.08 | 0.09 | 0.16 | 0.23 |
| | Adhesiveness | 5B | 5B | 5B | 5B | 5B | 4B | 4B |
| | durability | ○ | ○ | ○ | ○ | ○ | ○ | ○ |
| | Surface quality | 5 | 5 | 5 | 5 | 5 | 5 | 3 |

TABLE 3

|  |  | Exemplary example 8 | Exemplary example 9 | Exemplary example 10 | Exemplary example 11 | Exemplary example 12 | Exemplary example 13 | Exemplary example 14 |
|---|---|---|---|---|---|---|---|---|
| Coating layer forming component | Main resin (type/epoxy equivalent (g/eq)/content (parts by weight)) | BPA(YD-011)/550/100 | BPA(YD-011)/550/100 | BPA(YD-011)/550/100 | BPA(YD-011)/550/100 | BPA(YD-011)/550/100 | BPA(YD-136)/310/100 | BPA(YD-012H)/650/100 |
|  | Hardening Agent (kind/amine value (mgKOH/g)/content (parts by weight)) | PA(G-5022)/220/65 | PA(G-5022)/220/65 | PA(G-5022)/220/65 | PA(G-5022)/220/65 | PA(G-5022)/220/65 | PA(G-5022)/220/65 | PA(G-5022)/220/65 |
| Carbon-based filler | Type/content (parts by weight) | Carbon Black/22 | Carbon Black/22 | Carbon Black/22 | Carbon Black/22 | Carbon Black/22 | Carbon Black/22 | Carbon Black/22 |
|  | Average particle diameter (nm)/D90 (nm) | 31/64 | 58/65 | 234/253 | 261/280 | 240/272 | 150/192 | 150/192 |
| Property enhancing component (parts by weight) |  | 3 | 3 | 3 | 3 | 3 | 3 | 3 |
| The substrate on which the heat radiation coating layer is formed | Coating layer thickness (μm) | 25 | 25 | 25 | 25 | 25 | 25 | 25 |
|  | Heat radiation (%) | 14.53 | 14.53 | 14.53 | 14.15 | 14.00 | — | 12.95 |
|  | Radiation performance uniformity | 0.06 | 0.06 | 0.08 | 0.12 | 0.08 | — | 0.22 |
|  | Adhesiveness | 5B | 5B | 5B | 5B | 4B | 0B | 2B |
|  | durability | ○ | ○ | ○ | ○ | ○ | x | ○ |
|  | Surface quality | 5 | 5 | 5 | 4 | 3 | 5 | 5 |

TABLE 4

|  |  | Exemplary example 15 | Exemplary example 16 | Exemplary example 17 | Exemplary example 18 | Exemplary example 19 | Exemplary example 20 |
|---|---|---|---|---|---|---|---|
| Coating layer forming component | Main resin (type/epoxy equivalent (g/eq)/content (parts by weight)) | BPF(YDF-2001)/480/100 | Rubber-modified epoxy (KR-202C)/380/100 | DCPD(KDCP-150)/280/100 | BPA(YD-011)/550/100 | BPA(YD-011)/550/100 | BPA(YD-011)/550/100 |
|  | Hardening Agent (kind/amine value (mgKOH/g)/content (parts by weight)) | PA(G-5022)1220/65 | PA(G-5022)/220/65 | PA(G-5022)/220/65 | Amidoamine (G-A0533)/330/65 | Alicyclic amine (KH-825)/275/65 | Phenacamine (KMH-121X80)/200/65 |
| Carbon-based filler | Type/content (parts by weight) | Carbon Black/22 | Carbon Black/22 | Carbon Black/22 | Carbon Black/22 | Carbon Black/22 | Carbon Black/22 |
|  | Average particle diameter (nm)/D90 (nm) | 150/192 | 150/192 | 150/192 | 261/280 | 150/192 | 150/192 |
| Property enhancing component (parts by weight) |  | 3 | 3 | 3 | 3 | 3 | 3 |
| The substrate on which the heat radiation coating layer is formed | Coating layer thickness (μm) | 25 | 25 | 25 | 25 | 25 | 25 |
|  | Heat radiation (%) | — | 13.1 | 13.72 | 14.05 | 14.11 | 13.98 |
|  | Radiation performance uniformity | — | 0.19 | 0.18 | 0.10 | 0.11 | 0.15 |
|  | Adhesiveness | 0B | 1B | 1B | 2B | 0B | 0B |
|  | durability | x | ○ | ○ | ○ | x | x |
|  | Surface quality | 5 | 5 | 5 | 5 | 5 | 4 |

TABLE 5

| | | Comparative example 1 | Comparative example 2 | Comparative example 3 | Comparative example 4 |
|---|---|---|---|---|---|
| Coating layer forming component | Main resin (type/epoxy equivalent (g/eq)/content (parts by weight)) | BPA (YD-011)/550/100 | BPA (YD-011)/550/100 | BPA (YD-011)/550/100 | BPA (YD-011)/550/100 |
| | Hardening agent (kind/amine value (mgKOH/g)/content (parts by weight)) | PA (G-5022)/220/65 | PA (G-5022)/220/65 | PA (G-5022)/220/65 | PA (G-5022)/220/65 |
| filler | Type/content (parts by weight) | Carbon Black/5 | Carbon Black/75 | Titanium dioxide/22 | Carbon black/22 |
| | Average particle diameter (nm)/D90 (nm) | 150/192 | 150/192 | 208/255 | 150/190 |
| Property enhancing component (parts by weight) | | 3 | 3 | 3 | Not included |
| The substrate on which the heat radiation coating layer is formed | Coating layer thickness (μm) | 25 | 25 | 25 | 25 |
| | Heat radiation (%) | 8.7 | — | 12.35 | 13.25 |
| | Radiation performance uniformity | 0.07 | — | 0.13 | 0.28 |
| | Adhesiveness | 5B | 0B | 5B | 2B |
| | durability | ○ | × | ○ | × |
| | Surface quality | 5 | 2 | 5 | 5 |

As shown in Table 2,

It can be confirmed that the heat radiation property and the adhesiveness are simultaneously achieved in Exemplary Examples 1, 4 and 5 in which the content of the carbon-based filler is within the preferable range of the present invention, as compared with Examples 2, 3, 6 and 7. In particular, as can be seen in Exemplary Examples 6 and 7, even when the content of the carbon-based filler is increased, the degree of improvement of the heat radiation property is insignificant, and the adhesiveness is rather lowered. It is also confirmed that the uniformity of the radiation performance is also lowered.

Next, as shown in Table 3,

It can be confirmed that in Exemplary Example 1 and 8 to 12 in which the carbon black is contained in the same amount, in Exemplary Example 11 having an average particle diameter exceeding 250 nm, the surface quality is lowered and the radiation performance uniformity is lowered.

In addition, in the case of Exemplary Example 12 in which the D90 of the carbon black exceeded 260 nm, it was confirmed that the surface quality was remarkably deteriorated and the adhesiveness was also decreased at the same time.

On the other hand, in the case of Exemplary Example 13 in which the epoxy equivalent of the epoxy resin as the main resin is less than the preferable range, it can be confirmed that the adhesiveness and the durability are remarkably poor. In addition, in the case of Exemplary Example 14 in which the epoxy equivalent of the epoxy resin as the main resin exceeds the preferable range, the adhesiveness was remarkably lowered and the uniformity of the spinning performance was also lowered.

Next, as shown in Table 4,

In Exemplary Examples 15 to 17 in which epoxy resins other than the bisphenol A type epoxy were used as the main resin, it was confirmed that two or more of the properties of heat radiation, adhesiveness, durability and radiation uniformity were lowered. It can be seen that this is not suitable for achieving all properties.

In addition, in Exemplary Examples 18 to 20 in which other types than the polyamide type was used as the curing agent, the radiation performance was lower than that in Exemplary Example 1, and the adhesiveness and durability were remarkably deteriorated. In the case of Exemplary Example 20, it can be confirmed that the surface characteristics are also degraded.

Next, as shown in Table 5,

In the case of Comparative Example 1 in which the content of the carbon-based filler is out of the range according to the present invention, it can be confirmed that the heat radiation property is not significantly better than in the case of the present invention. In addition, in the case of Comparative Example 2, it can be confirmed that the durability, the adhesiveness and the surface characteristics are very poor.

In addition, in Comparative Example 3 in which the type of filler was titanium dioxide, adhesion and durability were excellent. Considering that the degree of heat-radiating is the level of Exemplary Example 2 and that the filler content of Exemplary Example 2 is less than ½ of that of Comparative Example 3, it can be expected that the carbon black is more excellent in heat radiation performance than titanium dioxide.

In addition, in Exemplary Example 4, which does not contain the physical property enhancing component, it is confirmed that both the radiation, the uniformity of the radiation adhesion and the durability ware all lowered.

As described above, the present invention has been described with respect to particularly preferred embodiments. However, the present invention is not limited to the above embodiments, and it is possible for one who has an ordinary skill in the art to make various modifications and variations, without departing off the spirit of the present invention.

What is claimed is:

1. A wireless power transmission device for a vehicle comprising
    a wireless power transmission module including at least one flat coil for transmitting wireless power and a magnetic field shielding sheet disposed at one side of the flat coil;
    a heat-radiating case coupled to one side of the wireless power transmission module, and including at least one circuit board for driving the wireless power transmission module, for emitting heat generated from the heat source;
    a heat-radiating coating layer applied to an outer surface of the heat-radiating case; and
    a cover detachably coupled to the heat-radiating case,
    wherein the heat radiating case is composed of a heat-radiating member forming composition including a graphite composite in which crystallized nanometer metal particles are bonded to the surface of the graphite and a polymer resin in which the graphite composite forms a dispersion phase.

2. The wireless power transmission device for the vehicle of claim 1, wherein the heat-radiating coating layer includes a coating layer-forming component comprising a main resin, a carbon-based filler in an amount of 8 to 72 parts by weight based on 100 parts by weight of the main resin, and a physical property enhancing component for improving heat-radiating and adhesion.

3. The wireless power transmission device for vehicle of claim 2, wherein the carbon-based filler includes at least one of graphite and carbon black.

4. The wireless power transmission device for the vehicle of claim 2, wherein the main resin is a glycidyl ether type epoxy resin including a bisphenol A type epoxy resin.

5. The wireless power transmission device for the vehicle of claim 4, wherein the bisphenol A type epoxy resin has an epoxy equivalent of 350 to 600 g/eq.

6. The wireless power transmission device for the vehicle of claim 2, wherein the carbon-based filler is carbon black having an average particle diameter of 250 nm or less.

7. The wireless power transmission device for the vehicle of claim 1, wherein the heat-radiating case includes a metal plate and a heat radiating member forming composition covering the outer surface of the metal plate, and the heat-radiating member-forming composition includes a graphite composite in which crystallized nanomaterial particles are bonded to the surface of the graphite, and a polymer resin in which the graphite composite forms a dispersed phase.

8. The wireless power transmission device for the vehicle of claim 1, wherein further comprising a heat-radiating plate made of a metal material so as to be attached to one surface of the magnetic field shielding sheet and fix the magnetic field shielding sheet to the heat-radiating case through a fastening member.

9. The wireless power transmission device for the vehicle of claim 8, wherein at least a part of the heat-radiating plate is disposed so as to be in direct contact with the heat-radiating case.

10. The wireless power transmission device for the vehicle of claim 8, wherein the heat-radiating plate includes at least one of copper and aluminum.

11. The wireless power transmission device for the vehicle of claim 8, wherein the magnetic field shielding sheet is formed with at least one first through-hole penetrating through a predetermined area so that the air around the flat coil moves toward the heat-radiating plate and the first through-hole is formed in a region corresponding to the hollow portion of the flat coil.

12. The wireless power transmission device for the vehicle of claim 11, wherein the heat-radiating plate has a second through-hole formed in a region corresponding to the first through hole with a predetermined area, and the circuit substrate has a temperature sensor disposed at a position corresponding to the second through-hole.

13. The wireless power transmission device for the vehicle of claim 8, wherein an insulation member for electrical insulation is disposed between the heat radiating plate and the circuit board.

14. The wireless power transmission device for the vehicle of claim 13, wherein a heat insulating layer is provided between the insulating member and the circuit board for preventing heat generated on the circuit board side from being conducted to the heat radiating plate.

15. The wireless power transmission device for the vehicle of claim 14, wherein the heat insulating layer is any one of a heat insulating sheet including hollow silica particles, a nanofiber web having micropores, and a coating layer coated with a heat reflecting material on at least one surface of the insulating member.

16. The wireless power transmission device for the vehicle of claim 1, wherein at least one heat transfer member for transferring heat generated from the circuit board to the heat radiating case side between the bottom surface of the heat-radiating case and the circuit board and at least one heat transfer member for increasing the heat-radiating performance is provided on one surface of the circuit board.

17. The wireless power transmission device for the vehicle of claim 16, wherein the heat transfer member is disposed in a region corresponding to a heat generating element mounted on the circuit board.

18. A wireless power transmission module for a vehicle comprising:
    a plurality of flat coils for transmitting wireless power;
    a magnetic field shielding sheet for shielding a magnetic field generated from the plurality of flat coils to prevent external leakage and condensing in a desired direction; and
    a heat-radiating plate made of a metal material and attached to a surface of the magnetic field shielding sheet, wherein the magnetic field shielding sheet is formed with at least one first through-hole penetrating through a predetermined area so that air around the flat coils moves toward the heat-radiating plate and the first through-hole is formed in a region corresponding to a hollow portion of at least one of the flat coils.

19. The wireless power transmission module for the vehicle of claim 18, wherein the heat-radiating plate includes at least one of copper and aluminum.

* * * * *